US012562305B2

(12) United States Patent
Ji

(10) Patent No.: US 12,562,305 B2
(45) Date of Patent: Feb. 24, 2026

(54) MAGNETIC ELEMENT, METHOD FOR MANUFACTURING MAGNETIC ELEMENT, AND POWER SUPPLY MODULE

(71) Applicant: Delta Electronics (Shanghai) Co., Ltd., Shanghai (CN)

(72) Inventor: Pengkai Ji, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 817 days.

(21) Appl. No.: 17/664,659

(22) Filed: May 24, 2022

(65) Prior Publication Data

US 2022/0392696 A1     Dec. 8, 2022

(30) Foreign Application Priority Data

Jun. 8, 2021     (CN) .......................... 202110637215.4

(51) Int. Cl.
H01F 27/28          (2006.01)
H01F 27/24          (2006.01)
          (Continued)

(52) U.S. Cl.
CPC ........... H01F 27/306 (2013.01); H01F 27/24 (2013.01); H01F 27/2804 (2013.01);
          (Continued)

(58) Field of Classification Search
CPC .... H01F 27/306; H01F 27/24; H01F 27/2804; H01F 27/40; H01F 41/041;
          (Continued)

(56) References Cited

U.S. PATENT DOCUMENTS 9,263,177 B1     2/2016   Ikriannikov et al.
10,347,409 B2    7/2019   Quilici
                 (Continued)

FOREIGN PATENT DOCUMENTS

CN          103430256  A     12/2013
CN          207098945  U      3/2018
                 (Continued)

OTHER PUBLICATIONS

Guangcan Li et al., "A High Power Density 48V-12V DCX with 3-D PCB Winding Transformer", pp. 463-467, IEEE, 2020.

*Primary Examiner* — Shawki S Ismail
*Assistant Examiner* — Kazi S Hossain
(74) *Attorney, Agent, or Firm* — CKC & Partners Co., LLC

(57)          ABSTRACT

A magnetic element includes a first magnetic column, a second magnetic column, a first winding wound around the first magnetic column, and a second winding wound around the second magnetic column. The first winding includes a first horizontal winding, a second horizontal winding, a first vertical winding, and a second vertical winding. The second winding includes a third horizontal winding, a fourth horizontal winding, a third vertical winding, and a fourth vertical winding. The first vertical winding and the third vertical winding are disposed on or in a first circuit board and a second circuit board respectively, the second vertical winding and the fourth vertical winding are disposed on or in a third circuit board. The first circuit board, the first magnetic column, the third circuit board, the second magnetic column, and the second circuit board are sequentially bonded to form a pre-package.

17 Claims, 20 Drawing Sheets

(51) Int. Cl.

| | |
|---|---|
| *H01F 27/30* | (2006.01) |
| *H01F 27/40* | (2006.01) |
| *H01F 41/04* | (2006.01) |
| *H05K 1/14* | (2006.01) |
| *H05K 3/40* | (2006.01) |

(52) U.S. Cl.
CPC ........... *H01F 27/40* (2013.01); *H01F 41/041* (2013.01); *H05K 1/14* (2013.01); *H05K 3/4038* (2013.01)

(58) Field of Classification Search
CPC .. H01F 2027/408; H01F 27/022; H01F 27/28; H01F 27/34; H01F 41/00; H05K 1/14; H05K 3/4038; H05K 1/165; H05K 3/4602; H05K 2201/086; H05K 2201/10015; H05K 2201/10166; H02M 3/003; H02M 3/01; H02M 3/33571; H02M 3/33573; H02M 3/33576
USPC ......................................... 336/200, 232, 192
See application file for complete search history.

(56) References Cited

U.S. PATENT DOCUMENTS

| | | | |
|---|---|---|---|
| 2006/0176139 A1* | 8/2006 | Pleskach | H01F 17/0033 336/223 |
| 2013/0056847 A1 | 3/2013 | Chen et al. | |

| | | | |
|---|---|---|---|
| 2015/0235753 A1 | 8/2015 | Chatani et al. | |
| 2017/0084384 A1* | 3/2017 | Otsubo | H01F 17/06 |
| 2017/0178794 A1 | 6/2017 | Yan et al. | |
| 2017/0222563 A1 | 8/2017 | Noma et al. | |
| 2017/0345756 A1 | 11/2017 | Yin et al. | |
| 2019/0333674 A1 | 10/2019 | Quilici | |
| 2020/0143985 A1 | 5/2020 | Cai et al. | |
| 2020/0161042 A1* | 5/2020 | Cai | H01F 27/027 |
| 2020/0169181 A1 | 5/2020 | Zhou et al. | |
| 2020/0260586 A1 | 8/2020 | Hong et al. | |
| 2021/0005378 A1 | 1/2021 | Hong et al. | |

FOREIGN PATENT DOCUMENTS

| | | |
|---|---|---|
| CN | 111145987 A | 5/2020 |
| CN | 111145988 A | 5/2020 |
| CN | 111952293 A | 11/2020 |
| CN | 112530680 A | 3/2021 |
| GB | 2299714 B | 11/1999 |
| JP | H0737712 A | 2/1995 |
| PL | 219054 B1 | 3/2015 |

* cited by examiner

100

200

MAGNETIC ELEMENT, METHOD FOR MANUFACTURING MAGNETIC ELEMENT, AND POWER SUPPLY MODULE

CROSS-REFERENCE TO RELATED APPLICATIONS

This non-provisional application claims priority under 35 U.S.C. § 119(a) on Patent Application No. 202110637215.4 filed in P.R. China on Jun. 8, 2021, the entire contents of which are hereby incorporated by reference.

Some references, if any, which may include patents, patent applications and various publications, may be cited and discussed in the description of this disclosure. The citation and/or discussion of such references, if any, is provided merely to clarify the description of the present disclosure and is not an admission that any such reference is "Prior Art" to the present disclosure described herein. All references listed, cited and/or discussed in this specification are incorporated herein by reference in their entireties and to the same extent as if each reference was individually incorporated by reference.

BACKGROUND OF THE INVENTION

1. Field of the Invention

The disclosure relates to the field of power supply, and particularly to a magnetic element, a method for manufacturing a magnetic element, and a power supply module.

2. Related Art

Currently, the market size of cloud (data center) and terminal (mobile phone, iPad, etc.) is getting larger and increasing rapidly. However, it also faces challenges in various aspects. For example, with the increasing of functions of various intelligent ICs, power consumption is increasing, there are more devices on a mainboard, and it is required that the power modules have a higher power density or a single power module has a larger current output capability. Moreover, with the improvement of computing capability of the intelligent ICs, the demand for dynamic performance of the power supply system also gets higher. With increasing power of an intelligent accelerator card and a server, a space for the power supply system on the system board is compressed, and demands for a higher power density, a smaller transmission loss, higher reliability, and better processibility are proposed for the power supply system. Currently, a planar transformer structure is often used in a DC-DC conversion power supply module with a transformer. The planar transformer structure forms a complete winding using traces of a printed circuit board (PCB). Moreover, the winding is vertical, magnetic columns are inserted into an inner bore of the winding, and the magnetic columns and covers are fixed by glue dispensing. The winding of the power supply module with such a structure is vertical, so that a current in the winding is uneven and loss is large. Moreover, an assembly tolerance, such as an assembly tolerance between the magnetic columns and the inner bore of the winding on the circuit board, of such structure is large, so the structure is not compact and loss of the winding or the magnetic core is large. Further, since the covers of the magnetic core are fixed by glue dispensing, they fall off easily, thereby affecting reliability. Alternatively, the transformer may also be formed with winding using a copper foil, but the process is complex and the accuracy of output terminals is poor, thereby affecting a yield.

Therefore, it is urgent to develop a solution capable of solving the problems.

SUMMARY OF THE INVENTION

To solve the above technical problem, the application provides a magnetic element, including:

a first magnetic column;

a second magnetic column;

a first winding wound around the first magnetic column, including:

a first horizontal winding and a second horizontal winding located above and below the first magnetic column, respectively, and a first vertical winding and a second vertical winding located at two sides of the first magnetic column, respectively; and a second winding wound around the second magnetic column, including:

a third horizontal winding and a fourth horizontal winding above and below the second magnetic column, respectively, and a third vertical winding and a fourth vertical winding at two sides of the second magnetic column, respectively;

wherein the first vertical winding and the third vertical winding are disposed on or in a first circuit board and a second circuit board, respectively, wherein the second vertical winding and the fourth vertical winding are disposed on or in a third circuit board, wherein the first circuit board, the first magnetic column, the third circuit board, the second magnetic column, and the second circuit board are sequentially bonded to form a pre-package, and wherein the first circuit board, the second circuit board, and the third circuit board are connected to the first horizontal winding, the second horizontal winding, the third horizontal winding, and the fourth horizontal winding through a plurality of first conductive vias, such that the first vertical winding, the first horizontal winding, the second vertical winding, and the second horizontal winding are sequentially connected through the plurality of first conductive vias, and that the fourth vertical winding, the third horizontal winding, the third vertical winding, and the fourth horizontal winding are sequentially connected through the plurality of first conductive vias.

The disclosure further provides a power supply module including the magnetic element, including:

an output pin disposed on a lower surface of the magnetic element; and an electronic component disposed on an upper surface, the lower surface, or a lateral surface of the magnetic element.

The disclosure further provides a method for manufacturing a magnetic element, including the steps of:

step S1, providing a first circuit board, a first magnetic column, a third circuit board, a second magnetic column, and a second circuit board, wherein a first vertical winding and a third vertical winding are disposed on or in the first circuit board and the second circuit board, respectively, and wherein a second vertical winding and a fourth vertical winding are disposed on or in the third circuit board;

step S2, sequentially assembling the first circuit board, the first magnetic column, the third circuit board, the second magnetic column, and the second circuit board to form a pre-package;

step S3, providing two second bonding layers bonded to an upper surface and a lower surface of the pre-package, respectively;

step S4, providing a fourth circuit board and a fifth circuit board bonded to surfaces of the two bonding layers, respectively, wherein a first horizontal winding and a third horizontal winding are disposed on or in the fourth circuit board, wherein a second horizontal winding and a fourth horizontal winding are disposed on or in the fifth circuit board, wherein the first horizontal winding and the second horizontal winding are disposed above and below the first magnetic column, respectively, and wherein the third horizontal winding and the fourth horizontal winding are disposed above and below the second magnetic column, respectively; and step S5, manufacturing a plurality of first conductive vias penetrating the two bonding layers, the fourth circuit board, and the fifth circuit board to reach the first circuit board, the second circuit board, and the third circuit board, such that the first vertical winding, the first horizontal winding, the second vertical winding, and the second horizontal winding are connected sequentially to form a first winding, and that the fourth vertical winding, the third horizontal winding, the third vertical winding, and the fourth horizontal winding are connected sequentially to form a second winding.

BRIEF DESCRIPTION OF THE DRAWINGS

FIG. 7b is a sectional view along AA in FIG. 7a.

FIG. 15b is a sectional view along ZZ in FIG. 15a.

DETAILED EMBODIMENTS OF THE INVENTION

Figure 1:
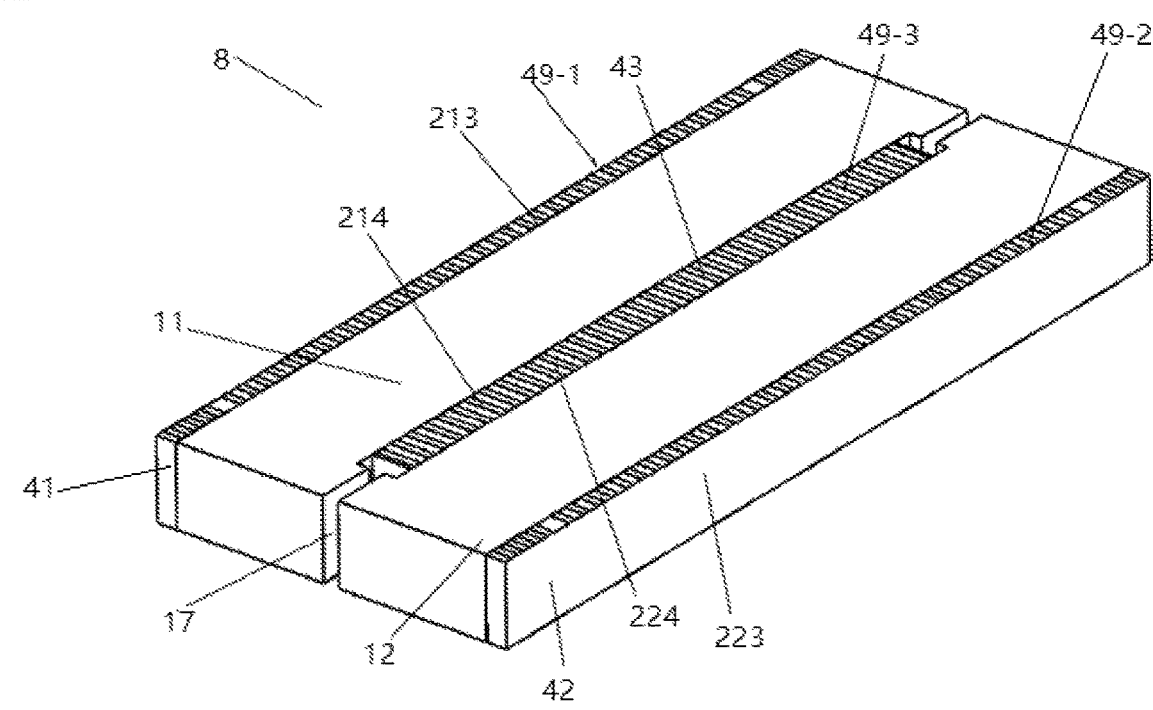
FIG. 1 is a structural diagram of a pre-package in a first embodiment of the disclosure.
Figure 2:
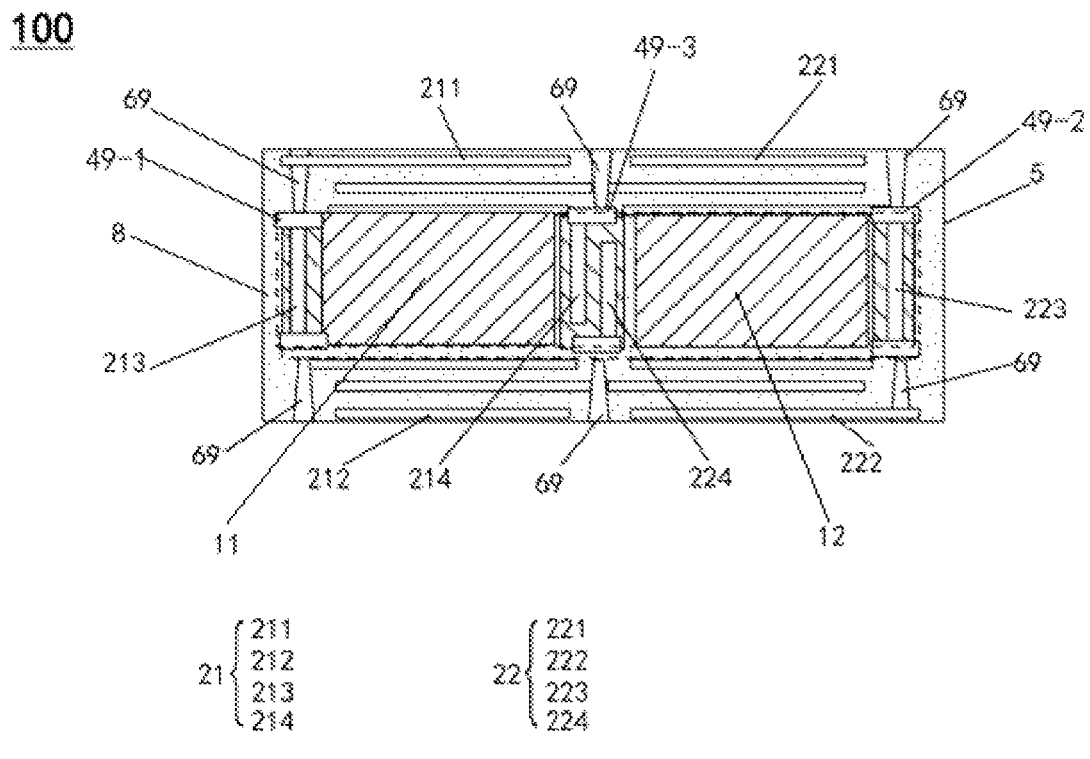
FIG. 2 is a structural diagram of a magnetic element including the pre-package.

FIG. 1 is a structural diagram of a pre-package in the first embodiment of the disclosure. FIG. 2 is a structural diagram of a magnetic element including the pre-package. A magnetic element 100 in this embodiment includes a first magnetic column 11, a second magnetic column 12, a first winding 21 wound around the first magnetic column 11, and a second winding 22 wound around the second magnetic column 12. The first winding 21 includes a first horizontal winding 211 and a second horizontal winding 212 above and below the first magnetic column 11, respectively, and a first vertical winding 213 and a second vertical winding 214 at both sides of the first magnetic column 11, respectively. The second winding 22 includes a third horizontal winding 221 and a fourth horizontal winding 222 above and below the second magnetic column 12, respectively, and a third vertical winding 223 and a fourth vertical winding 224 at both sides of the second magnetic column 12, respectively. The first vertical winding 213 and the third vertical winding 223 are disposed on or in a first circuit board 41 and a second circuit board 42 respectively, and the second vertical winding 214 and the fourth vertical winding 224 are disposed on or in a third circuit board 43 respectively. The first circuit board 41, the first magnetic column 11, the third circuit board 43, the second magnetic column 12, and the second circuit board 42 are sequentially bonded to form a pre-package 8. End faces of the first circuit board 41, the second circuit board 42, and the third circuit board 43 are provided with terminals 49-1, 49-2, and 49-3. It shall be noted that the circuit boards include upper and lower surfaces, with the end faces being between the upper and lower surfaces. The first circuit board 41 is at an outer side of the first magnetic column 11, the second circuit board 42 is at an outer side of the second magnetic column 12, and the third circuit board 43 is between the first magnetic column 11 and the second magnetic column 12.

Referring to FIGS. 1 and 2, the first circuit board 41, the second circuit board 42, and the third circuit board 43 all have a conductive circuit layer, and the first vertical winding 213, the second vertical winding 214, the third vertical winding 223, and the fourth vertical winding 224 are formed by at least a part of the conductive circuit layer on or in the respective circuit boards. In the application, the first circuit board 41, the second circuit board 42, and the third circuit board 43 with the vertical windings are referred to as vertical winding circuit boards. Each of the terminals 49-1, 49-2, and 49-3 are electrically connected to the corresponding conductive circuit layers on or in the three circuit boards. For example, the first vertical winding 213 is disposed on or in the first circuit board 41, the third vertical winding 223 is disposed on or in the second circuit board 42, and the second vertical winding 214 and the fourth vertical winding 224 are disposed on or in the third circuit board 43. Preferably, the terminals 49-1 of the first circuit board 41, the terminals 49-2 of the second circuit board 42, and the terminals 49-3 of the third circuit board 43 are in a common plane, thereby facilitating subsequent connection with the horizontal windings, improving the manufacturing process, allowing the structure to be compact, improving power density, reducing connection impedance, and improving efficiency.

Referring to FIG. 2 again, the pre-package 8 is packed in an insulating material 5. Specifically, an upper surface and a lower surface of the pre-package 8 are coated by an insulating material, or an insulated packaging material 5 is at least formed on the upper surface, the lower surface, and a part of the lateral face of the pre-package 8. A rectangular dashed box in FIG. 2 illustrates that the pre-package 8 is packed in the insulating material 5.

Referring to FIG. 2 again, the horizontal windings can be formed by metallization. For example, insulating material 5 is disposed on the upper surface of the pre-package 8. The horizontal windings are formed in the insulating material 5 of the upper and lower surfaces of the pre-package 8, i.e., the first horizontal winding 211, the second horizontal winding 212, the third horizontal winding 221, and the fourth horizontal winding 222 are all in the insulating material 5. For example, the first horizontal winding 211 and the second horizontal winding 212 are formed in the insulating material 5 of the upper surface of the pre-package 8, and the third horizontal winding 221 and the fourth horizontal winding 222 are formed in the insulating material 5 of the lower surface of the pre-package 8. With such repetition, the horizontal windings with a multi-layered structure may be formed. The horizontal windings with higher accuracy can be realized through the method of packaging process and metallization, such as electroplating by the way of photo-etching mask, such that a more compact structure is realized.

Moreover, first conductive vias 69 of the respective horizontal windings formed by electroplating or other metallization are electrically connected to the terminals on the circuit boards where the corresponding vertical windings are located. Specifically, the first circuit board 41, the second circuit board 42, and the third circuit board 43 are connected to the first horizontal winding 211, the second horizontal winding 212, the third horizontal winding 221, and the fourth horizontal winding 222 through the plurality of first conductive vias 69, such that the first vertical winding 213, the first horizontal winding 211, the second vertical winding 214, and the second horizontal winding 212 are sequentially connected through the plurality of first conductive vias 69, and that the fourth vertical winding 224, the third horizontal winding 221, the third vertical winding 223, and the fourth horizontal winding 222 are sequentially connected through the plurality of first conductive vias 69.

Figure 3:
FIG. 3 is a structural diagram of a magnetic element in a second embodiment of the disclosure.
Figure 3:
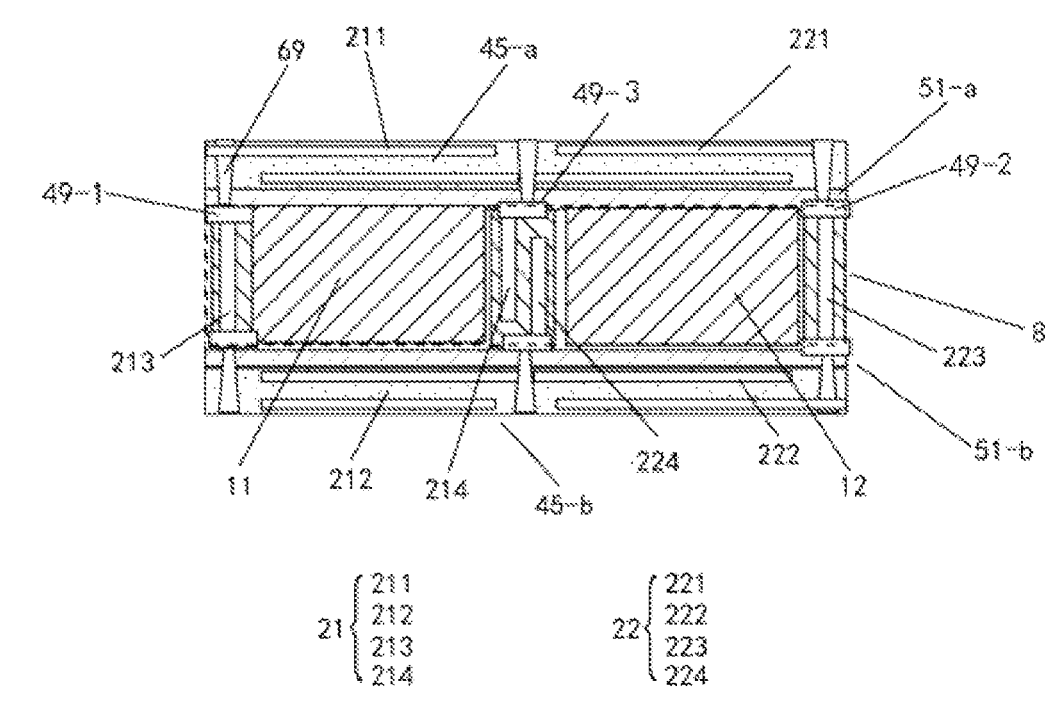

FIG. 3 is a structural diagram of a magnetic element in a second embodiment of the disclosure. In this embodiment, the magnetic element is similar to the magnetic element shown in FIGS. 1 to 2, and the same component signs represent the same component, structure, and function, so the details are not described here. This embodiment differs from the first embodiment in that a fourth circuit board 45-a is disposed on an upper surface of the pre-package 8, and a fifth circuit board 45-b is disposed on a lower surface of the pre-package 8. That is, the first horizontal winding 211 and the third horizontal winding 221 on the upper surface of the pre-package 8 are formed on the fourth circuit board 45-a, and the second horizontal winding 212 and the fourth horizontal winding 222 on the lower surface of the pre-package 8 are formed on the fifth circuit board 45-b. The fourth circuit board 45-a and the fifth circuit board 45-b refer to horizontal winding circuit boards. The fourth circuit board 45-a and the fifth circuit board 45-b both have a conductive circuit layer, and the first horizontal winding 211, the second horizontal winding 212, the third horizontal winding 221, and the fourth horizontal winding 222 are formed by at least a part of the conductive circuit layer in the respective circuit boards. The magnetic element further includes two second bonding layers 51-a and 51-b disposed on the upper surface and the lower surface of the pre-package 8 respectively. The plurality of first conductive vias 69 penetrate through the two second bonding layers 51-a and 51-b and connect the conductive circuit layers on or in the fourth circuit board 45-a and the fifth circuit board 45-b to the terminals 49-1 of the first circuit board 41, the terminals 49-2 of the second circuit board 42, and the terminals 49-3 of the third circuit board 43. Specifically, the first conductive vias 69 penetrate through the fourth circuit board 45-a and the two second bonding layers 51-a and 51-b, such that the first horizontal winding 211 and the third horizontal winding 221 on the fourth circuit board 45-a are electrically connected to the terminals 49-1, 49-2, and 49-3 of the respective circuit boards where the first vertical winding 213, the second vertical winding 214, the third vertical winding 223, and the fourth vertical winding 224 are located.

The fourth circuit board 45-a disposed on the upper surface of the pre-package 8 and the fifth circuit board 45-b disposed on the lower surface of the pre-package 8 are bonded to the pre-package 8 to form an integral body through the two second bonding layers 51-a and 51-b. The pre-package 8 is used as a special circuit board, and the fourth circuit board 45-a and the fifth circuit board 45-b with the horizontal windings are bonded to the pre-package 8 to form an integral body through the second bonding layers using the manufacturing process of the circuit boards. Then, the first conductive vias 69 are formed by way of laser drilling to connect the corresponding conductive circuit layers (the corresponding horizontal windings) in the fourth circuit board 45-a and the fifth circuit board 45-b to the terminals 49-1 of the first circuit board 41, the terminals 49-2 of the second circuit board 42, and the terminals 49-3 of the third circuit board 43. Specifically, the corresponding conductive circuit layers, such as copper layers, can be disposed on or in the fourth circuit board 45-a or the fifth circuit board 45-b. The copper layers are removed at positions of laser drilling holes. The positions for laser drilling are corresponding to the terminals 49-1 of the first circuit board 41, the terminals 49-2 of the second circuit board 42, and the terminals 49-3 of the third circuit board 43, and are adjacent to the conductive circuit layer in the fourth circuit board 45-*a* or the fifth circuit board 45-*b*. During laser drilling, the laser can effectively penetrate through the fourth circuit board 45-*a* or the fifth circuit board 45-*b* and the two second bonding layers 51-*a* and 51-*b*, till the terminals 49-1 of the first circuit board 41, the terminals 49-2 of the second circuit board 42, and the terminals 49-3 of the third circuit board 43. When laser scans the conductive circuit layers at corresponding positions of the fourth circuit board 45-*a* or the fifth circuit board 45-*b*, the conductive circuit layers will not be destroyed, such that laser drilled vias are adjacent to the conductive circuit layers. Subsequently, the first conductive vias 69 are formed by electroplating or metallization. The first conductive vias 69 can electrically connect the conductive circuit layers at the corresponding positions of the fourth circuit board 45-*a* or the fifth circuit board 45-*b* to the terminals 49-1 of the first circuit board 41, the terminals 49-2 of the second circuit board 42, and the terminals 49-3 of the third circuit board 43. The fourth circuit board 45-*a* or the fifth circuit board 45-*b* is bonded to the pre-package 8 to form an integral body through the two second bonding layers 51-*a* and 51-*b*, thereby simplifying the process, and reducing cost. An adhesive or a prepreg may be used for the two second bonding layers 51-*a* and 51-*b*.

Figure 4:
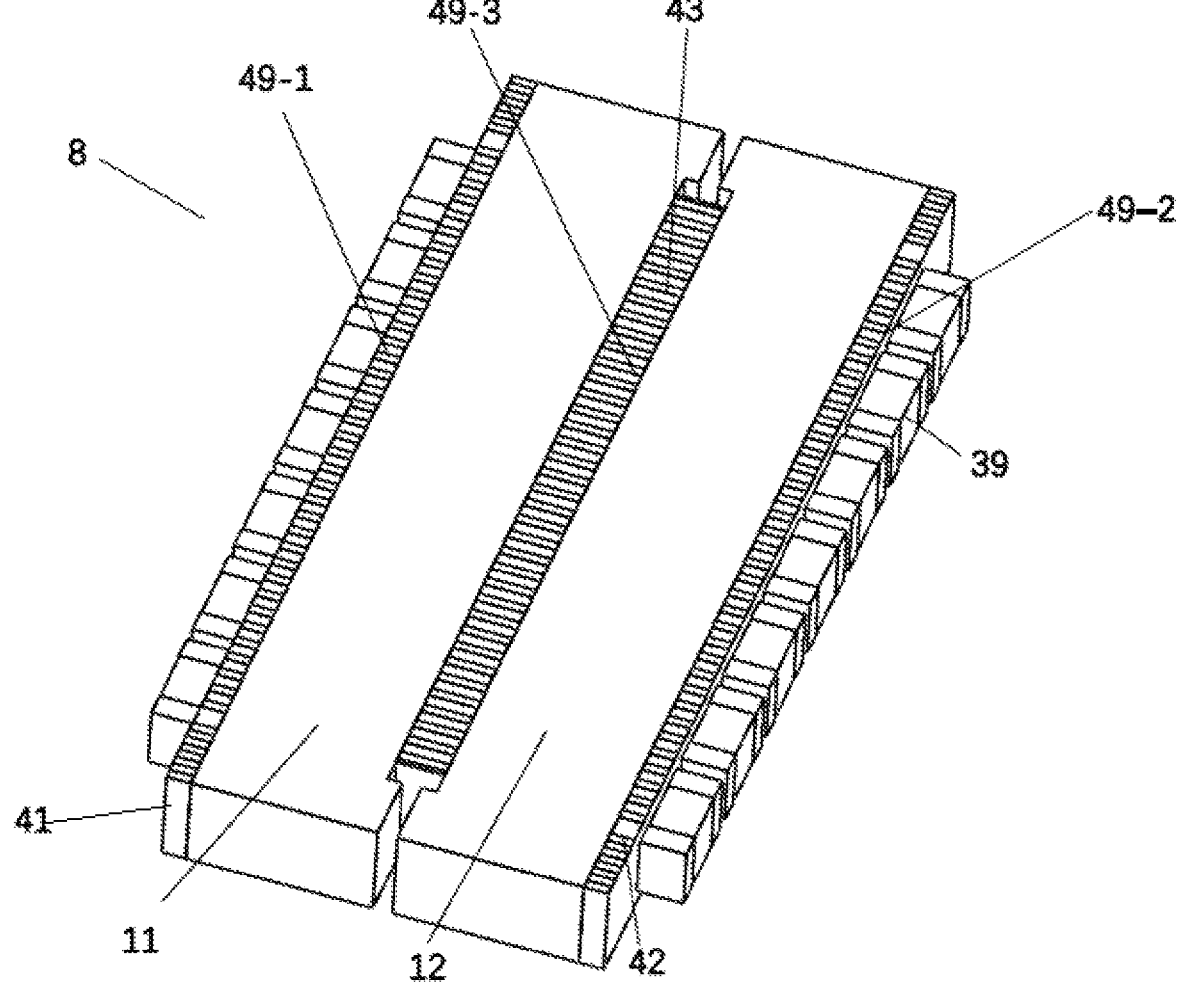
FIG. 4 is a schematic diagram of electronic devices disposed on the pre-package in a third embodiment of the application.

FIG. 4 is a schematic diagram of electronic devices disposed on the pre-package in a third embodiment of the application. What is different from FIG. 1 is electronic devices, such as, capacitors 39 or switching devices, disposed at an outer side of the first circuit board 41. Similarly, electronic devices, such as the capacitors 39 or the switching devices, can also be disposed at an outer surface of the second circuit board 42. Then, electronic devices and the pre-package are packaged to form the horizontal windings and the first conductive vias 69. The capacitors are surface mounted to the first circuit board 41 and the second circuit board 42, and the conventional capacitors can be used. For example, it is unnecessary to use capacitors with copper terminals, such that cost can be reduced, and a supply chain can be simplified. Moreover, the structure is more compact, thereby better facilitating reducing parasitic inductance or connection impedance between the capacitors or the switching devices (e.g., the rectifier diodes) and the windings, and improving efficiency. Of course, in some embodiments, the capacitors may also be embedded into the first circuit board 41 or the second circuit board 42, thereby further improving the compactness of the structure.

Figure 5:
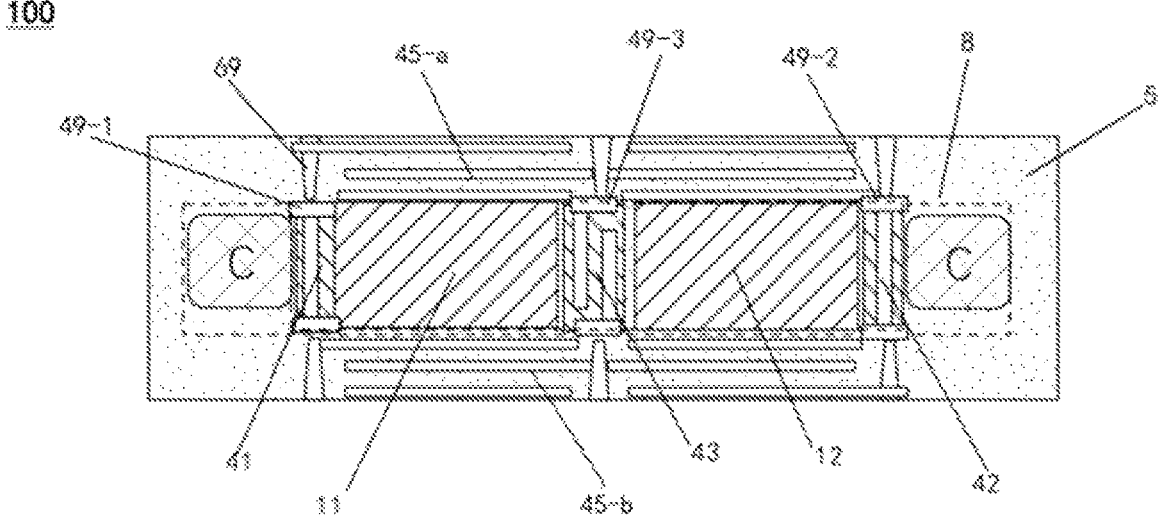
FIG. 5 is a schematic diagram of electronic devices disposed on the magnetic element in the third embodiment of the application.
Figure 6A:
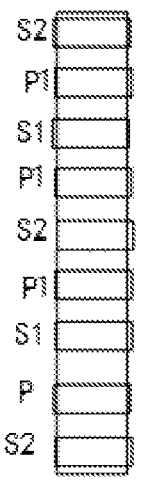
FIG. 6a is a schematic diagram of the arrangement of terminals on vertical winding circuit boards in one embodiment.
Figure 6B:
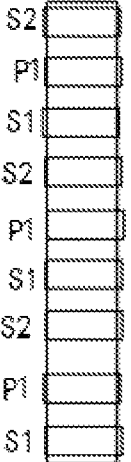
FIG. 6b is a schematic diagram of the arrangement of terminals on vertical winding circuit boards in another embodiment.

FIG. 5 is a schematic diagram of electronic devices disposed on the magnetic element in the third embodiment of the application. As shown in FIG. 5, an end face of the first circuit board 41 is provided with the terminals 49-1, an end face of the second circuit board 42 is provided with the terminals 49-2, and an end face of the third circuit board 43 is provided with the terminals 49-3. Arrangement of the terminals 49-1 may refer to FIGS. 6a and 6b. FIG. 6a is a schematic diagram of the arrangement of terminals of the first circuit board 41 in one embodiment and FIG. 6b is a schematic diagram of the arrangement of terminals of the first circuit board 41 in another embodiment. Arrangement of the terminals on the end face of the first circuit board 41 may use the arrangement of the terminals shown in FIG. 6a or 6b. Preferably, the second circuit board 42 and the first circuit board 41 can use the same arrangement of terminals. For example, as for a half-bridge full-wave rectification winding structure, the terminals of the first circuit board 41 are in an arrangement shown in FIG. 6a or 6b. The first winding 21 can include a first secondary winding, and the terminals corresponding to the first secondary winding are 51. The first winding 21 can also include a second secondary winding, and the terminals corresponding to the second secondary winding are S2. Further, the first winding 21 can also include a first primary winding, and the terminals corresponding to the first primary winding are P1. The second winding 22 can include a third secondary winding, and the terminals corresponding to the third secondary winding are S3. The second winding 22 can also include a fourth secondary winding, and the terminals corresponding to the fourth secondary winding are S4. Further, the second winding 22 can also include a second primary winding, and the terminals corresponding to the second primary winding are P2. The numbers of turns of the first primary winding and the second primary winding are determined according to a turn ratio. The arrangement shown in FIG. 6a or 6b enables the primary and secondary windings to be arranged alternatively, thereby facilitating uniform distribution of a high-frequency current and improving efficiency. In addition, it shall be further noted that the terminals 49-1 and the terminals 49-2 can be formed by electroplating of stamp holes on the end faces of the first circuit board 41 and the second circuit board 42.

Figure 7A:
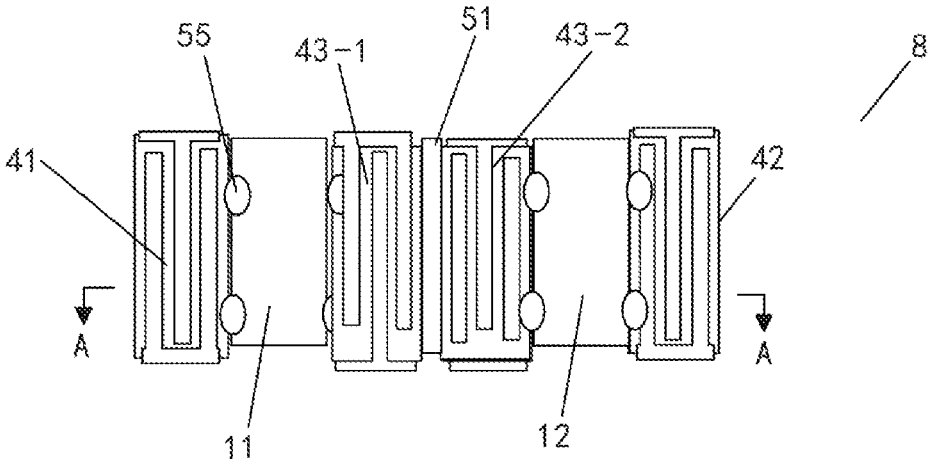
FIG. 7a is a structural diagram of a pre-package in a fourth embodiment of the disclosure.
Figure 7B:
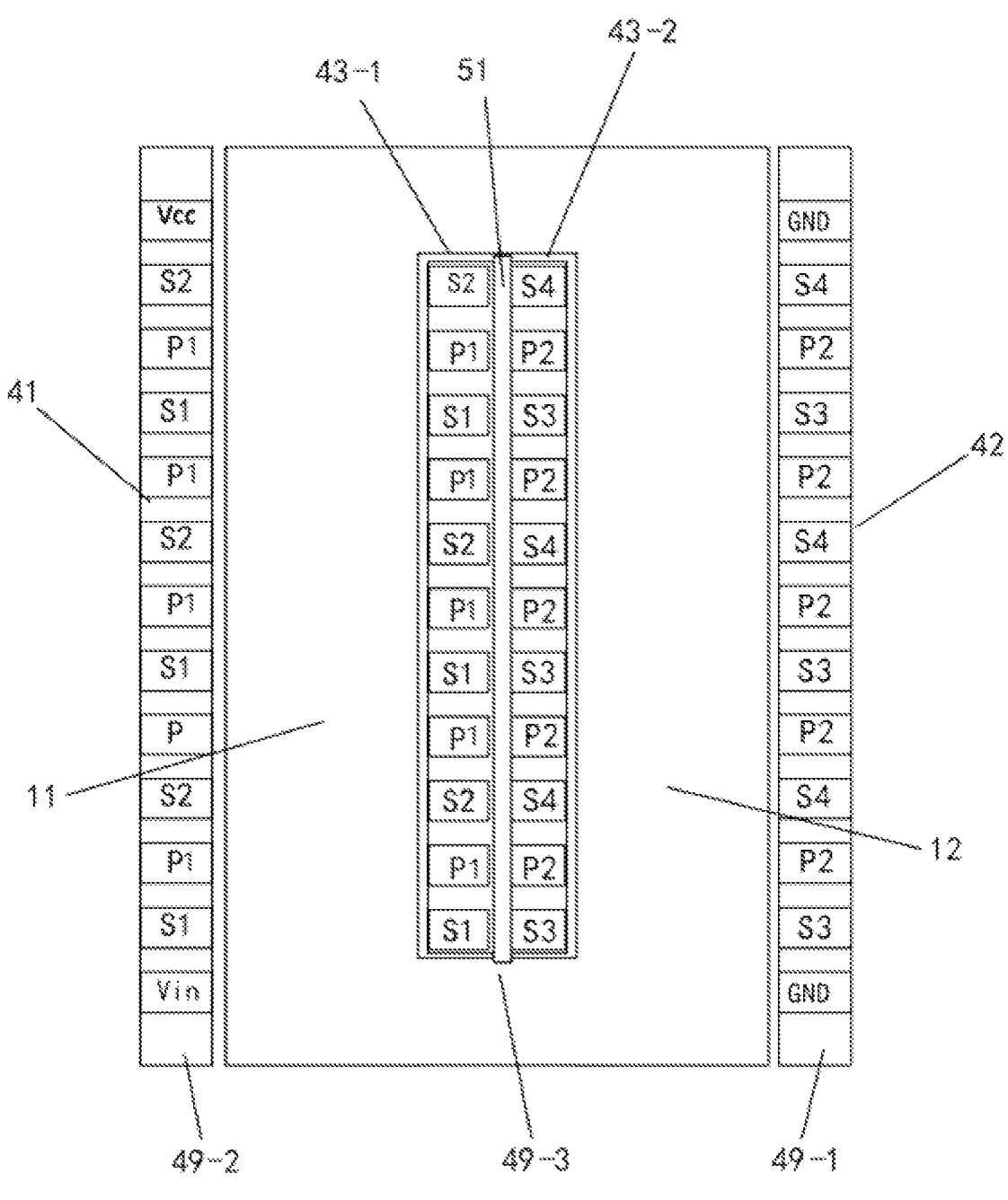

FIG. 7a is a structural diagram of a pre-package in a fourth embodiment of the disclosure and FIG. 7b is a sectional view along AA in FIG. 7a. In this embodiment, the magnetic element is similar to the magnetic element shown in FIGS. 1 to 6, and the same component signs represent the same component, structure, and function, so the details are not described here. This embodiment differs from the second embodiment in that the third circuit board 43 between the first magnetic column 11 and the second magnetic column 12 may be formed by two separate circuit boards 43-1 and 43-2, and the two separate circuit boards 43-1 and 43-2 are bonded by a first bonding layer 51, such that an arrangement structure of the terminals of the third circuit board 43 shown in FIG. 7b can be formed. The second vertical winding 214 and the fourth vertical winding 224 are disposed on or in the two separate circuit boards 43-1 and 43-2, respectively. FIG. 7b shows an arrangement diagram of terminals on end faces of the vertical winding circuit boards. An end face of each of the separate circuit boards has a plurality of terminals 49-3 arranged in a column, while those terminals of the third circuit board 43 are in two columns. In some embodiments, the terminals 49-1, 49-2, and 49-3 are in a form of pads. Referring to FIG. 7b again, the terminals 49-1, 49-2, and 49-3 are disposed on the end face of the first circuit board 41, the end face of the second circuit board 42, and the end face of the third circuit board 43, respectively. The terminals 49-1 are provided with a power supply output terminal Vcc and a power supply input terminal Vin. S1 represents terminals corresponding to the secondary winding of the transformer, S2 represents terminals corresponding to another secondary winding of the transformer, and P represents terminals corresponding to the primary winding of the transformer. The terminals 49-2 are provided with a ground terminal GND, the terminals S1 corresponding to the secondary winding of the transformer, the terminals S2 corresponding to another secondary winding of the transformer, and the terminals P corresponding to the primary winding of the transformer. The terminals 49-3 have two columns of symmetric terminals with the terminals S1 corresponding to the secondary winding of the transformer, the terminals S2 corresponding to another secondary winding of the transformer, and the terminals P corresponding to the primary winding of the transformer.

FIG. 7a also illustrates that the first magnetic column 11, the first circuit board 41 and the third circuit board 43 are bonded together by glue dispensing 55. And the second magnetic column 12, the third circuit board 43 and the second circuit board 42 can also be bonded together by glue dispensing 55. The glue dispensing 55 can be only a transition application during the process. After the pre-package 8 is packaged, the insulated encapsulating material 5 and the first conductive vias 69 can realize firmly connection of the entire structure, and it is unnecessary for the glue dispensing 55 to ensure reliability between the magnetic columns and the first circuit board 41, the second circuit board 42 or the third circuit board 43 during reflow solder or long-term application. In such a way, dependency of glue dispensing can be reduced, reliability of structure can be largely improved, and influence of the glue dispensing on the stress of the magnetic material can be reduced, thereby improving the efficiency of the power supply module.

The terminals of the first circuit board 41 and the second circuit board 42 are arranged in a column and can be electrically separated by the insulated first bonding layer 51. In such a way, an arrangement structure of the column terminals can be formed, thereby facilitating the arrangement of the terminals of the third circuit board 43, and the application is flexible. The terminals of the first circuit board 41 and the terminals of the second circuit board 42 may also form multiple columns of terminals arranged in parallel similarly, thereby facilitating forming an arrangement of multiple columns of terminals, facilitating connection of the horizontal windings and the vertical windings through the conductive vias, and realizing the winding structure in more complex or distributed arrangement to expand the application range of the disclosure.

Figure 8A:
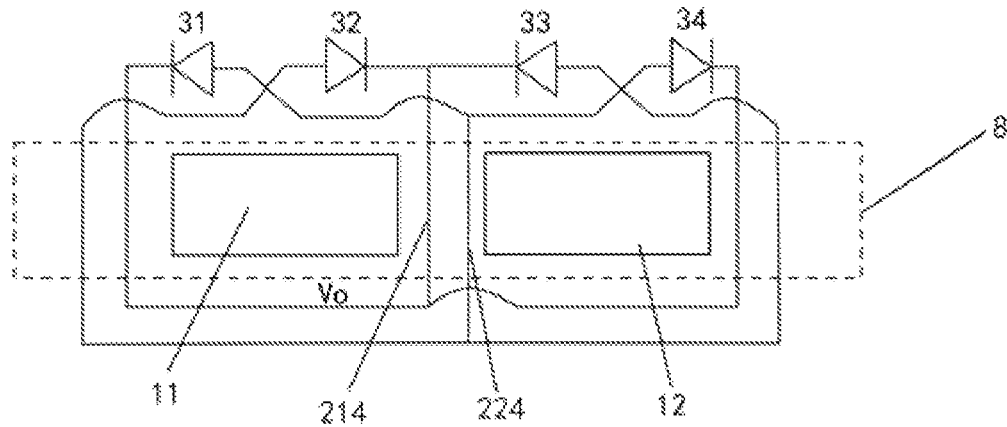
FIG. 8a is a schematic diagram of reusing windings in a fifth embodiment of the disclosure.
Figure 8B:
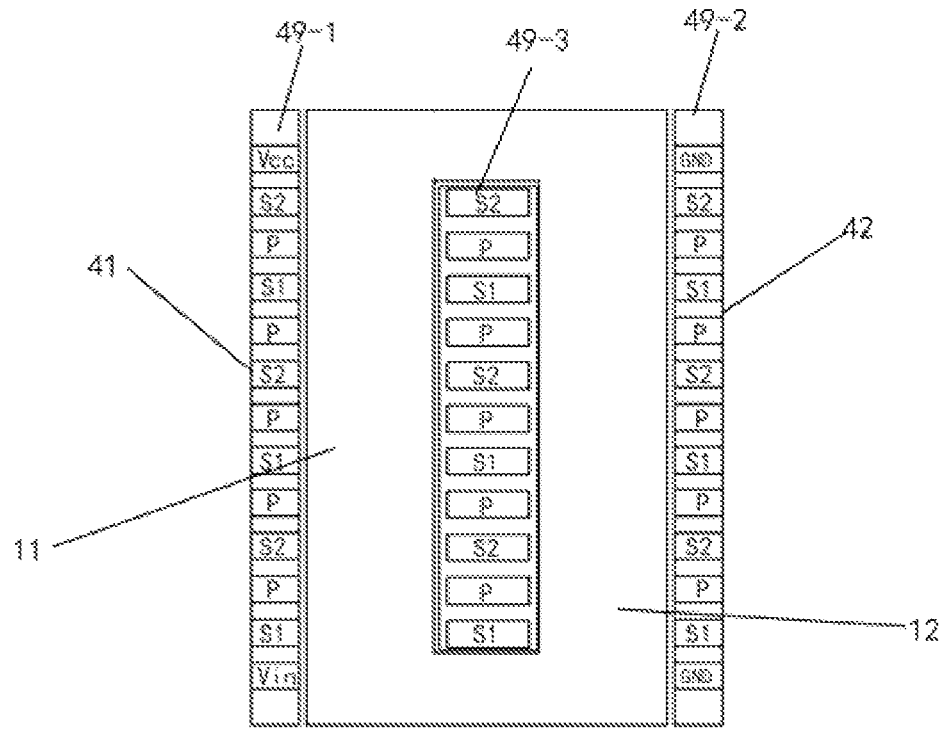
FIG. 8b is an arrangement diagram of terminals on end faces of vertical winding circuit boards in the fifth embodiment of the disclosure.

FIG. 8a is a schematic diagram of reusing windings in a fifth embodiment of the disclosure and FIG. 8b is an arrangement diagram of terminals on end faces of vertical winding circuit boards in the fifth embodiment of the disclosure. In this embodiment, the magnetic element is similar to the magnetic element shown in FIGS. 1 to 6, and the same component signs represent the same component, structure, and function, so the details are not described here. This embodiment differs from the fourth embodiment in that the windings between the first magnetic column 11 and the second magnetic column 12 can be integrally reused, the second vertical winding 214 and the fourth vertical winding 224 share one section of the conductive circuit layer, and the terminals 49-3 of the third circuit board 43 can be in one column. The third terminals 49-3 of the column include terminals 51 corresponding to the secondary winding of the transformer, terminals S2 corresponding to another secondary winding of the transformer, and terminals P corresponding to the primary winding of the transformer, and are arranged alternatively. The terminals 49-3 are in a form of pads. As is compared to FIG. 7b, the types and the number of the terminals 49-3 may be largely reduced, thereby simplifying the structure, and facilitating customer's application.

In FIG. 8a, the part in the dashed box is the pre-package 8 and rectifier devices 31 to 34 are disposed above the magnetic core, such that the types and the number of the terminals on the third circuit board 43 between the first magnetic column 11 and the second magnetic column 12 can be reduced.

Figure 9:
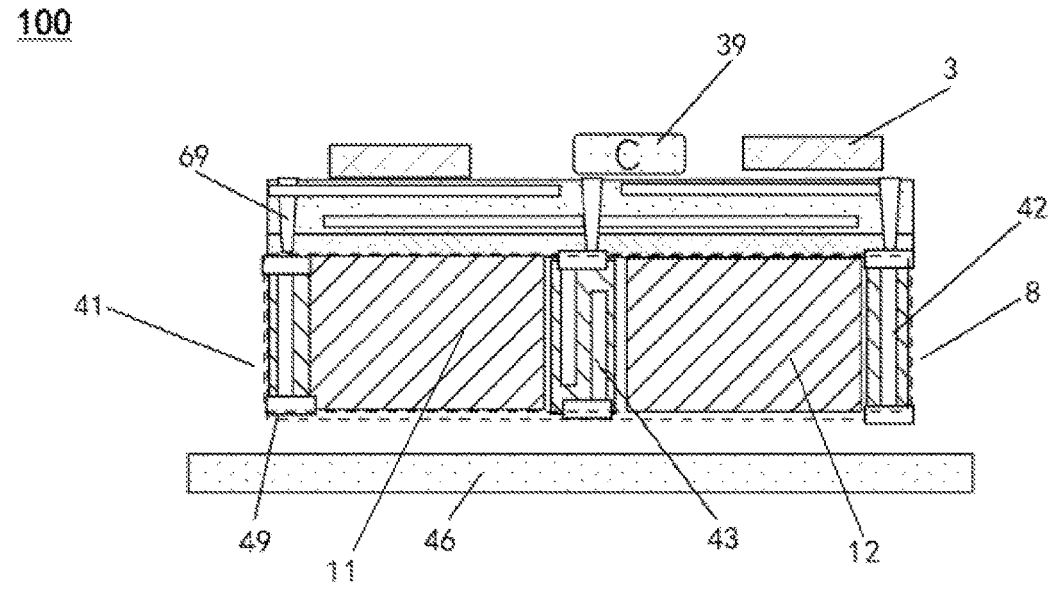
FIG. 9 is a structural diagram of a magnetic element in a sixth embodiment of the disclosure.

FIG. 9 is a structural diagram of a magnetic element in a sixth embodiment of the disclosure. The horizontal windings integrated by the package are disposed above the pre-package 8 and electrically connected through the first con-ductive vias 69. The terminals 49 in a form of pads are disposed on a lower surface of the pre-package 8, i.e., lower end faces of the first circuit board 41, the second circuit board 42, and the third circuit board 43. The terminals 49 in the form of pads can be soldered to other circuit boards, such as a system circuit board 46. The horizontal windings are disposed on or in the system circuit board 46 to form a complete winding. In addition, other devices, such as power devices, controllers, or other electronic devices, can also be disposed on the system circuit board 46, such that a plurality of power supply modules can be formed flexibly. The electronic devices, such as the switching devices 3 or the capacitors 39, can also be disposed on the upper surfaces of the horizontal windings, such that connection impedance is small, the loss is small, heat dissipation is convenient, the structure is compact, and application is flexible. Further-more, a tiny concave-convex structure can also be disposed on the end faces of the circuit boards where the respective vertical windings are located, and bonding strength between the end faces of the circuit boards where the respective vertical windings are located and the insulated packaging material 5 can be enhanced, thereby improving the reliabil-ity of the structure.

Figure 10:
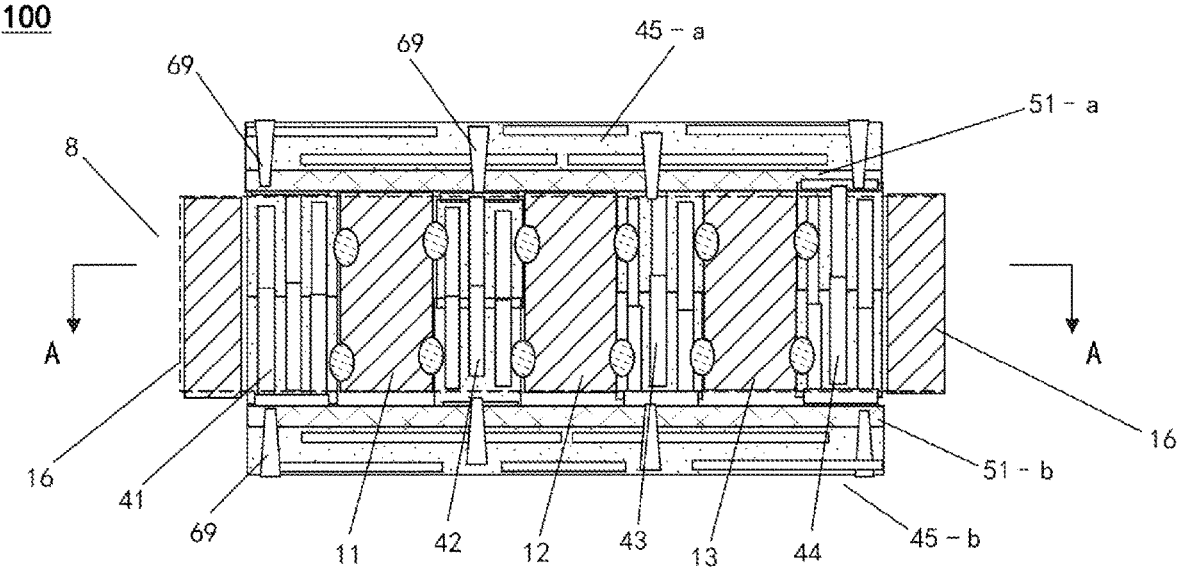
FIG. 10 is a structural diagram of a magnetic element in a seventh embodiment of the disclosure.
Figure 11:
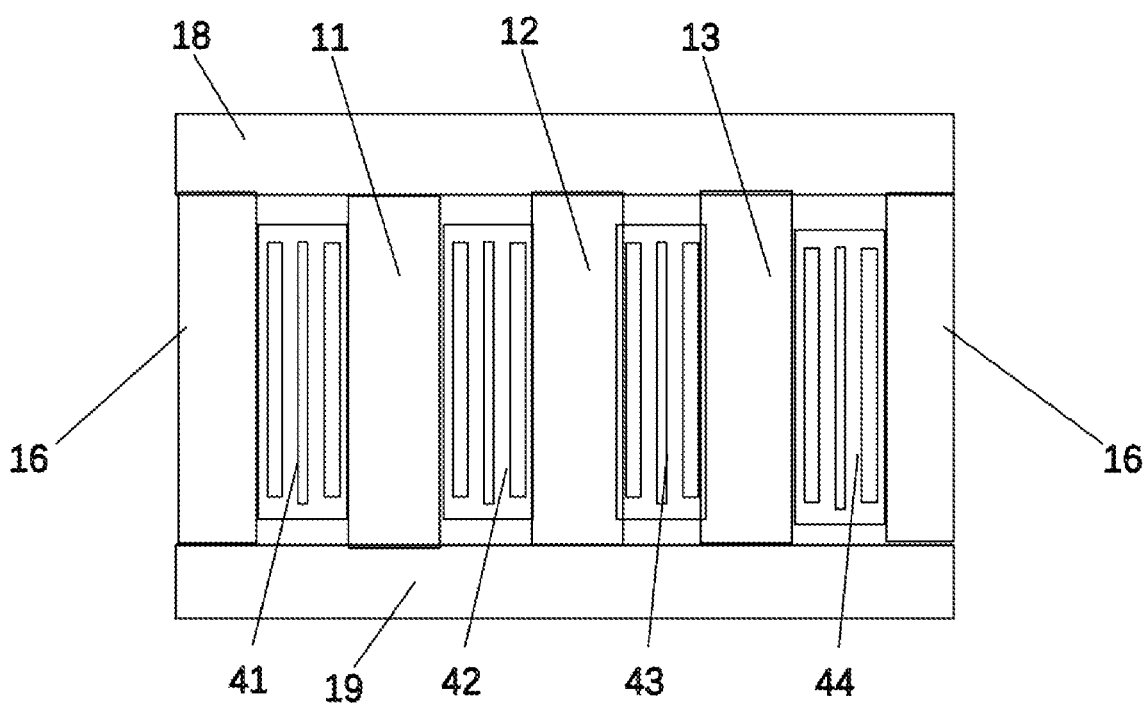
FIG. 11 is a sectional view along AA in FIG. 10.

FIG. 10 is a structural diagram of a magnetic element in a seventh embodiment of the disclosure. In this embodiment, the magnetic element is similar to the magnetic element shown in FIGS. 1 to 6, and the same component signs represent the same component, structure, and function, so the details are not described here. This embodiment differs from the fourth embodiment in that the pre-package 8 can also be provided with more magnetic columns. For example, a third magnetic column 13 and a sixth circuit board 44 may be provided, wherein the third magnetic column 13 is positioned between the third circuit board 43 and the sixth circuit board 44. Alternatively, side magnetic columns 16 can also be disposed at an outer side of the two side circuit boards. For example, the side magnetic column 16 is at the outer side of the first circuit board 41, and the side magnetic column 16 is at the outer side of the six circuit board 44, such that the number of magnetic columns of pre-package 8 can be flexibly expanded, thereby facilitating improving power, reducing magnetic loss, realizing balance of mag-netic fluxes of the magnetic loop, facilitating equality of output voltages of the multiple circuits, and facilitating parallel output. FIG. 11 is a sectional view along A-A in FIG. 10. A first magnetic cover 18 and a second magnetic cover 19 are disposed on two end faces of the respective magnetic columns to form a complete magnetic loop. The vertical winding circuit boards, such as the first circuit board 41, the second circuit board 42, the third circuit board 43, and the sixth circuit board 44, are arranged between magnetic col-umns. The vertical winding circuit boards and the adjacent magnetic columns can be closely bonded, so the structure is compact. The magnetic loop and the windings are short, and efficiency is high, thereby facilitating expansion.

Figure 12:
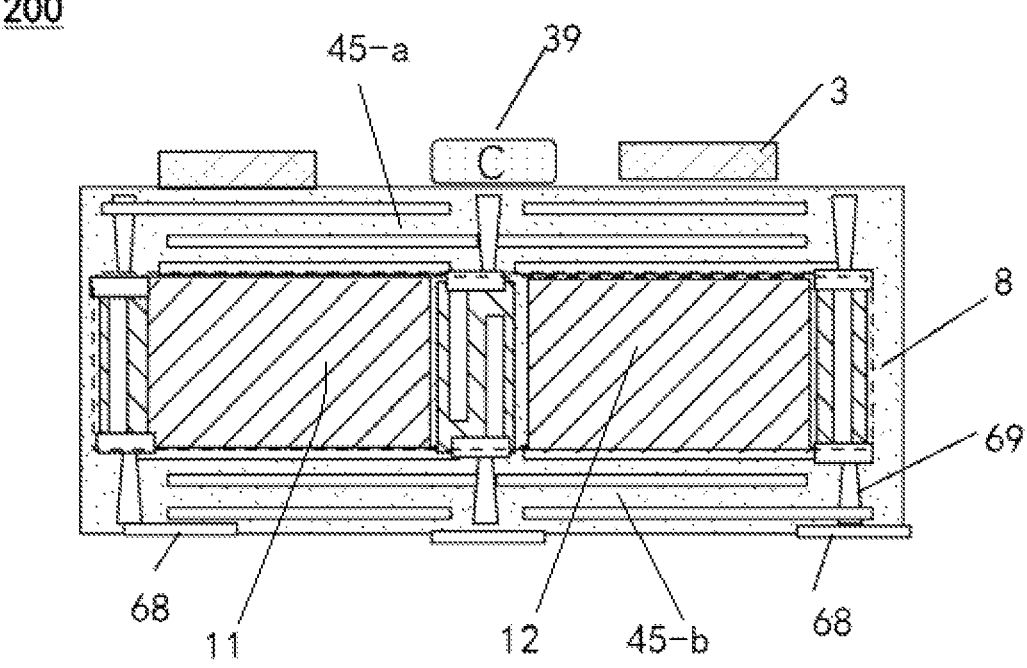
FIG. 12 is a structural diagram of a power supply module in one embodiment of the disclosure.

FIG. 12 is a structural diagram of a power supply module in one embodiment of the disclosure. On the basis of the pre-package 8 formed in the aforementioned embodiments, the horizontal windings are provided and the electronic elements, such as the passive elements of the power switch-ing devices 3 or the capacitors 39, are disposed on an upper surface, a lower surface, or a lateral side of the magnetic element, to form a complete power supply module, and an output pin 68 is disposed on a lower surface of the power supply module. In the aforementioned embodiments, the first magnetic column 11 and the second magnetic column 12 may be a U-shaped magnetic core. The structure is simple and compact, connection lines are short, and loss is small. The power devices are arranged above the pre-package 8 to facilitate heat dissipation. The output pin 68 is directly disposed on a bottom surface of the magnetic element, so the structure is compact and the output pin can be disposed flexibly and accurately, making applications flexible and convenient.

Figure 13:
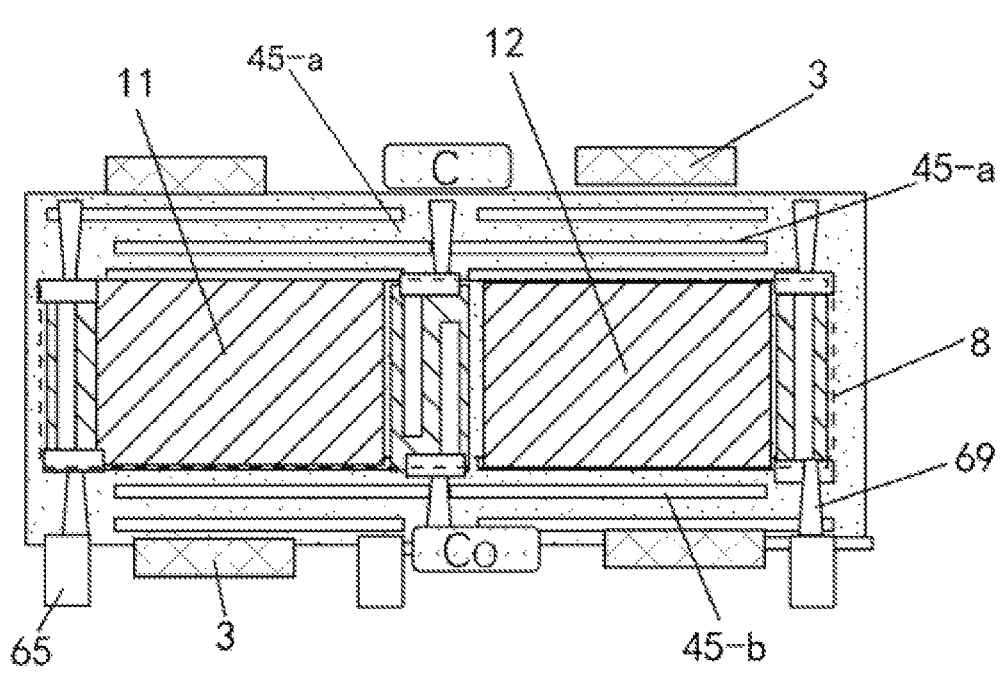
FIG. 13 is a structural diagram of a power supply module in another embodiment of the disclosure.

FIG. 13 is a structural diagram of a power supply module in another embodiment of the disclosure. The power devices 3 or the capacitors can also be disposed on the lower surface of the pre-package 8, and the output pin can be formed on the lower surface with a copper block 65. Such structure can increase the surface area of the devices, thereby facilitating improving power density.

Referring to FIGS. 14*a* to 14*l*, the embodiment shows a method for manufacturing a magnetic element, including steps S1, S2, S3, and S4. Refer to FIG. 1 at the same time. In the step S1, a first circuit board 41, a first magnetic column 11, a third circuit board 43, a second magnetic column 12, and a second circuit board 42 are provided, wherein a first vertical winding 213 and a third vertical winding 223 are disposed on or in the first circuit board 41 and the third circuit board 42 respectively, and a second vertical winding 214 and a fourth vertical winding 224 are disposed on or in the third circuit board 43. In step S2, referring to FIG. 14*c*, the first circuit board 41, the first magnetic column 11, the third circuit board 43, the second magnetic column 12, and the second circuit board 42 are sequentially assembled to form a pre-package 8, and the pre-package may be a panel structure.

In step S3, two second bonding layers are provided, and the two second bonding layers are bonded to an upper surface and a lower surface of the pre-package 8 respectively. In the step S4, a fourth circuit board 45-*a* and a fifth circuit board 45-*b* are provided, and the fourth circuit board 45-*a* is bonded to the bonding layer on the upper surface of the pre-package 8 and the fifth circuit board 45-*b* is bonded to the bonding layer on the lower surface of the pre-package 8, wherein a first horizontal winding 211 and a third horizontal winding 221 are disposed on or in the fourth circuit board 45-*a*, and a second horizontal winding 212 and a fourth horizontal winding 222 are disposed on or in the fifth circuit board 45-*b*. The first horizontal winding 211 and the second horizontal winding 212 are disposed above and below the first magnetic column 11, respectively, and the third horizontal winding 221 and the fourth horizontal winding 222 are disposed above and below the second magnetic column 12, respectively. In the step S5, a plurality of first conductive vias are formed to penetrate through the two bonding layers, the fourth circuit board 45-*a* and the fifth circuit board 45-*b* to reach the first circuit board 41, the second circuit board 42, and the third circuit board 43, such that the first vertical winding 213, the first horizontal winding 211, the second vertical winding 214 and the second horizontal winding 212 are sequentially connected to form a first winding 21, and the fourth vertical winding 224, the third horizontal winding 221, the third vertical winding 223 and the fourth horizontal winding 222 are sequentially connected to form a second winding 22.

Figure 14A:
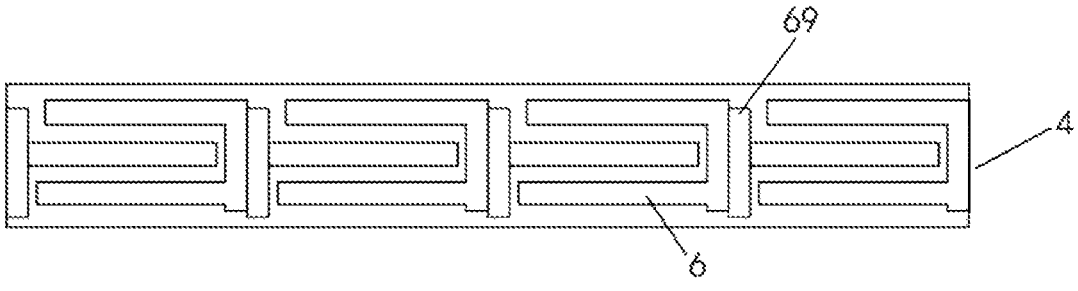
FIG. 14a is a panel structure circuit board with conductive vias.
Figure 14B:
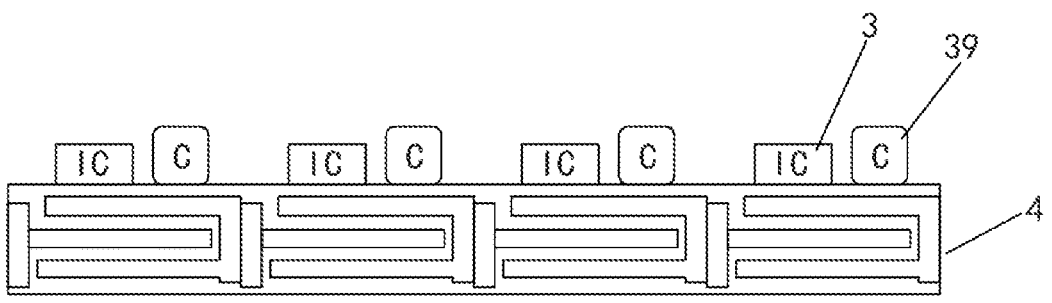
FIG. 14b is a schematic diagram of electronic devices disposed on the panel structure circuit board.
Figure 14C:
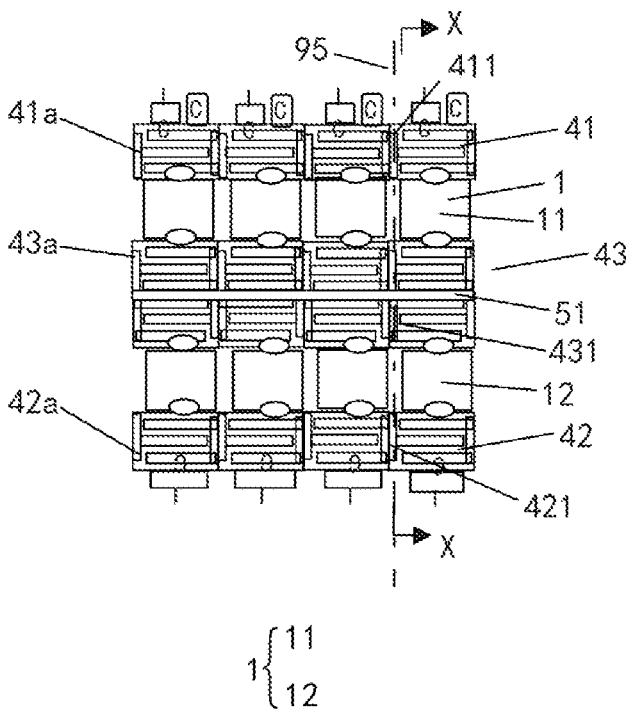
FIG. 14c is a structural diagram of an array pre-package.

Still further, referring to FIGS. 14*a* to 14*c*, FIG. 14*a* is a panel structure circuit board with conductive vias, FIG. 14*b* is a schematic diagram of electronic devices disposed on the panel structure circuit board, and FIG. 14*c* is a structural diagram of an array pre-package. Referring to FIG. 14*a*, the panel structure circuit board 4 has a conductive circuit layer 6 with a preset structure and a plurality of first conductive vias 69. In some embodiments, the manufacturing method includes providing a first panel circuit board 41*a* including a plurality of the first circuit boards 41, a second panel circuit board 42*a* including a plurality of the second circuit boards 42, and a third panel circuit board 43*a* including a plurality of the third circuit boards 43. The first panel circuit board 41*a*, the second panel circuit board 42*a*, and the third panel circuit board 43*a* are provided with a plurality of second conductive vias 411, a plurality of third conductive vias 421, and a plurality of fourth conductive vias 431. The first panel circuit board 41*a*, a plurality of the first magnetic columns 11, the third panel circuit board 43*a*, a plurality of the second magnetic columns 12, and the second panel circuit board 42*a* are sequentially bonded. Then, by cutting along cutting lines passing through the plurality of second conductive vias 411, the plurality of third conductive vias 421, and the plurality of fourth conductive vias 431, the pre-package 8 is obtained. and to form terminals at positions corresponding to the plurality of second conductive vias 411 on end faces of the first circuit board 41, at positions corresponding to the plurality of third conductive vias 421 on end faces of the second circuit board 42, and at positions corresponding to the plurality of fourth conductive vias 431 on end faces of the third circuit board 43. Referring to FIG. 14*a* and FIG. 14*c*, in the method for manufacturing the magnetic element of this embodiment, the structure of panel circuit board 4 is used for the first panel circuit board 41*a*, the second panel circuit board 42*a*, and the third panel circuit board 43*a*. As shown in FIG. 14*b*, devices, such as the power devices 3 or passive elements like the capacitors 39, also can be soldered on the panel structure.

Even further, end faces of the first circuit board 41, the second circuit board 42, and the third circuit board 43 are provided with terminals. In the step S5, the fourth circuit board 45-*a* and the fifth circuit board 45-*b* are laser drilled at positions corresponding to the terminals of the first circuit board 41, the second circuit board 42, and the third circuit board 43 using a laser to form through holes at the corresponding positions of the fourth circuit board and the fifth circuit board. Walls of the through-holes are electrically connected to the first horizontal winding 211, the third horizontal winding 221, the second horizontal winding 212, and the fourth horizontal winding 222. Then, the through-holes are metalized to form vias to electrically connect the terminals of the first circuit board 41, the second circuit board 42, and the third circuit board 43 to the first horizontal winding 211, the third horizontal winding 221, the second horizontal winding 212 and the fourth horizontal winding 222.

Figure 14D:
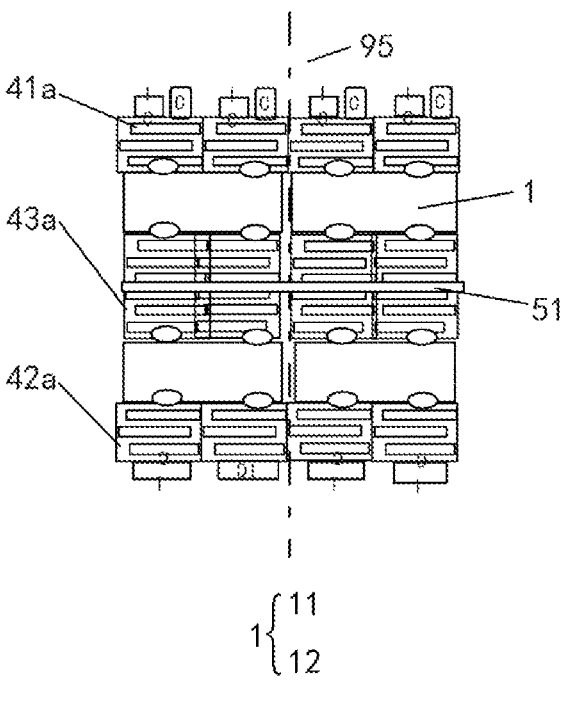
FIG. 14d is a sectional view along XX in FIG. 14c.
Figure 14E:
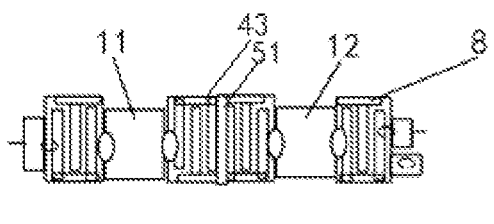
FIG. 14e is a structural diagram of a pre-package after the array pre-package is cut in one embodiment.
Figure 14F:
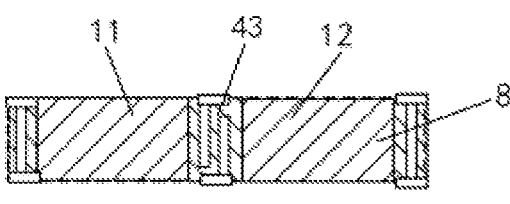
FIG. 14f is a structural diagram of a pre-package after the array pre-package is cut in another embodiment.
Figure 14G:
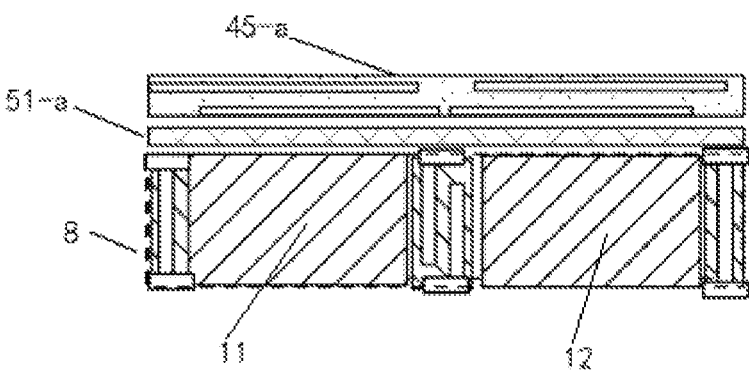
FIG. 14g is a structural diagram of a pre-package after the pre-package is bonded to a fourth circuit board.
Figure 14H:
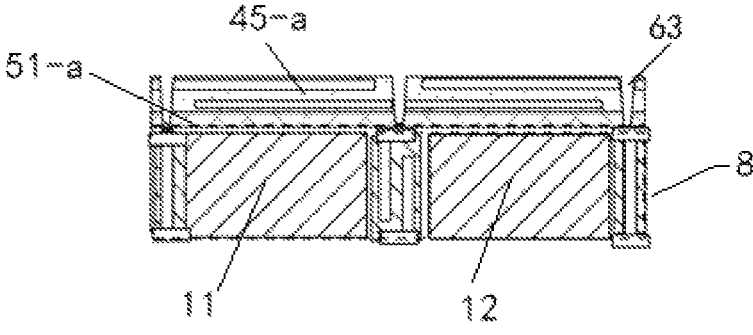
FIG. 14h is a structural diagram of a pre-package having laser holes.
Figure 14I:
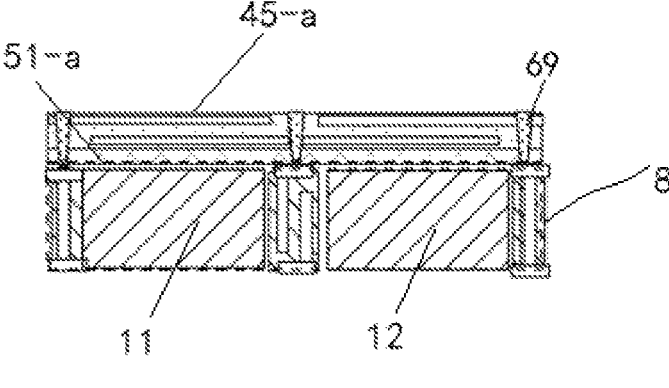
FIG. 14i is a structural diagram of a pre-package after the first conductive vias are metalized.
Figure 14J:
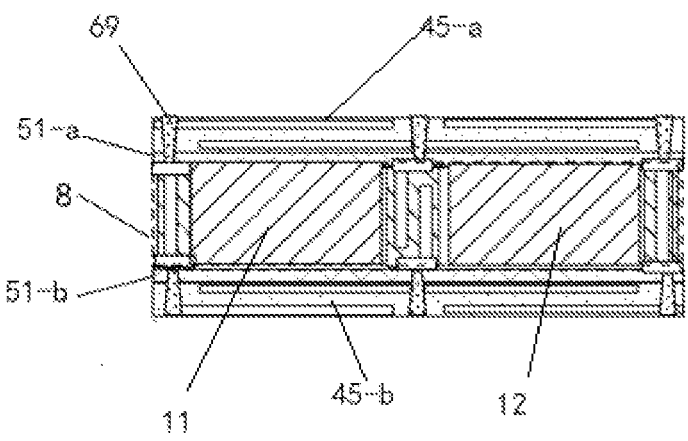
FIG. 14j is a schematic diagram of bonding the pre-package in FIG. 14i to a fifth circuit board.
Figure 14K:
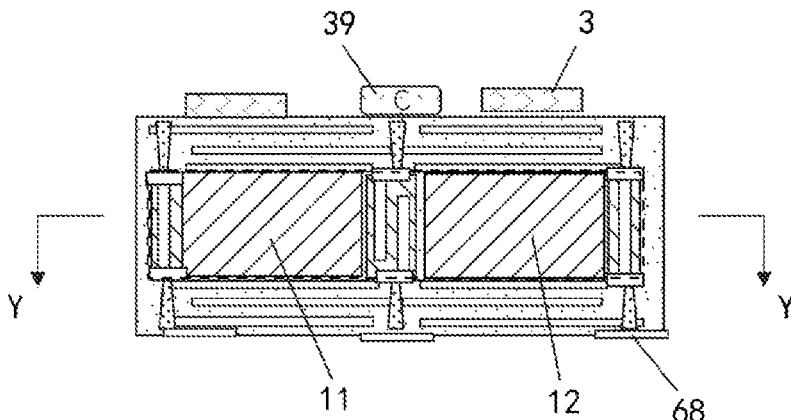
FIG. 14k is a schematic diagram of electronic devices disposed on a magnetic element.
Figure 14L:
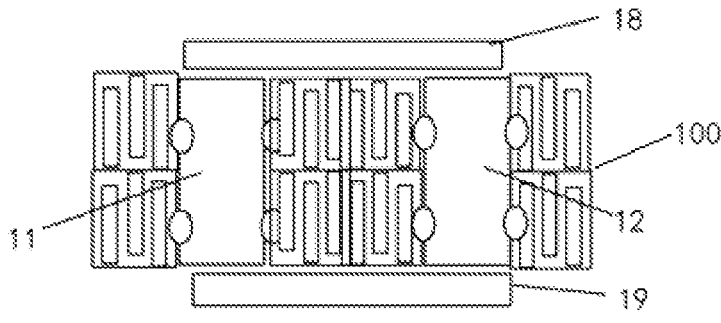
FIG. 14l is a sectional view along YY in FIG. 14k.

Hereinafter manufacturing flows of the magnetic element of the disclosure are described in detail with reference to the steps shown in FIGS. 14*c* to 14*l*. FIG. 14*d* is a sectional view along X-X in FIG. 14*c* and cut is performed along a cutting line 95 in FIGS. 14*c* and 14*d*. Referring to FIG. 14*e*, FIG. 14*e* is a structural diagram of a pre-package after an array pre-package is cut in one embodiment. The pre-package 8 shown in FIG. 14*e* can be obtained after a portion at the right of the cutting line 95 in FIG. 14*c* is cut off and rotated by 90 degrees clockwise or counterclockwise. Referring to FIG. 14*c*, the cutting line 95 can pass through the first conductive vias 69. After cutting, terminals are formed on the end faces of the circuit boards, i.e., terminals at the ends of the vertical winding circuit boards. Referring to FIG. 14*f*, FIG. 14*f* is a structural diagram of a pre-package after the array pre-package is cut in another embodiment. FIG. 14*f* differs from FIG. 14*e* in that the third circuit board 43 in FIG. 14*f* is a separate circuit board, while the third circuit board 43 in FIG. 14*e* is formed by bonding two circuit boards through the first bonding layer 51. To facilitate subsequent displaying, the electronic elements are not disposed at an outer side of the shown pre-package. Further, referring to FIG. 14g, FIG. 14g is a structural diagram of a pre-package after the pre-package is bonded to a fourth circuit board, and illustrates that the second bonding layer 51-*a* and the fourth circuit board 45-*a* are disposed on the upper surface of the pre-package formed in the previous steps. FIG. 14h is a structural diagram of a pre-package having laser holes. In FIG. 14h, the laser holes 63 are formed by irradiation of a laser. The laser beam can remove the insulating material, but cannot destroy the conductive circuit layer (i.e., the copper layer) in the horizontal winding 45, and cannot destroy the terminals of the vertical winding circuit boards either, such that the laser holes 63 can reach to the terminals (generally, the copper layers) on the upper surfaces of the vertical winding circuit boards, and the corresponding conductive circuit layers on the fourth circuit board 45-*a* can adjoin the laser holes 63. Then, the inner surfaces of the laser holes 63 are metalized to form the first conductive vias 69. Referring to FIG. 14i, FIG. 14i is a structural diagram of a pre-package after the first conductive vias 69 are metalized. The inner surfaces of the laser holes 63 are metalized to connect the corresponding conductive circuit layer (i.e., the horizontal winding) on or in the fourth circuit board 45-*a* to the terminals on the upper surfaces of the vertical winding circuit boards. Referring to FIG. 14j, FIG. 14j is a schematic diagram of bonding the pre-package in FIG. 14i to a fifth circuit board, and further illustrates disposing the second bonding layer 51-*b* below the pre-package 8 to bond the pre-package formed in FIG. 14i to the fifth circuit board 45-*b* to form a complete winding. The conductive vias may be blind holes, i.e., the conductive vias may be formed by electroplating using laser drilling holes. Till now, the magnetic element is formed. Terminals can be disposed on the upper surface or the lower surface of the magnetic element for external connection. FIG. 14k is a schematic diagram of electronic devices disposed on a magnetic element, and further illustrates elements such as the power devices 3 or the capacitors 39 soldered to a surface of the magnetic element, and an output pin 68 disposed on the lower surface. FIG. 14l is a sectional view along Y-Y in FIG. 14k and illustrates that the first magnetic cover 18 and the second magnetic cover 19 at both ends of the first magnetic column 11 and the second magnetic column 12 form a complete magnetic loop, and the first magnetic cover 18 and the second magnetic cover 19 can also be bonded to the first magnetic column 11 and the second magnetic column 12 using a glass bead glue. Air gaps of the magnetic loop are controlled by controlling a gap between the first magnetic cover 18, the second magnetic cover 19, and the magnetic columns.

Figure 15B:
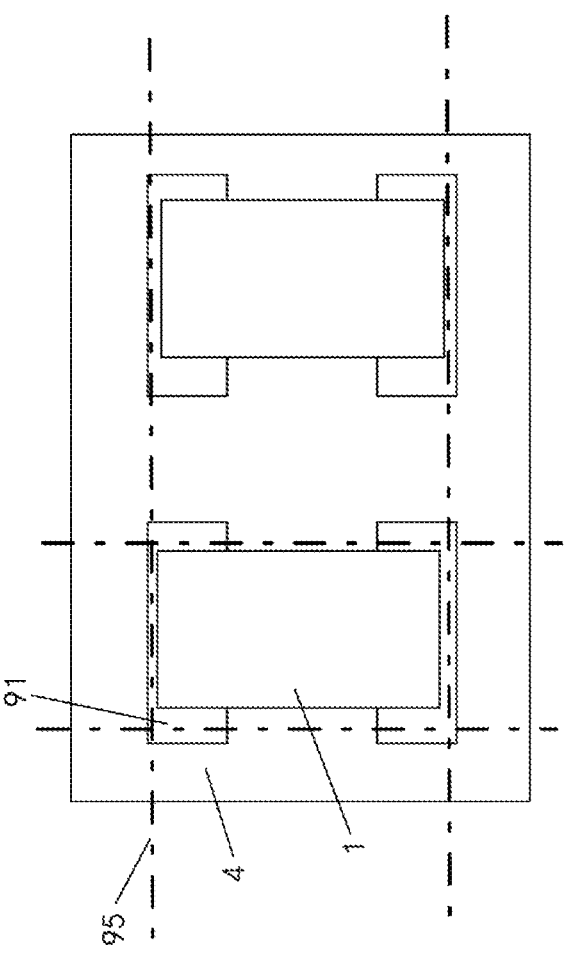
Figure 15A:
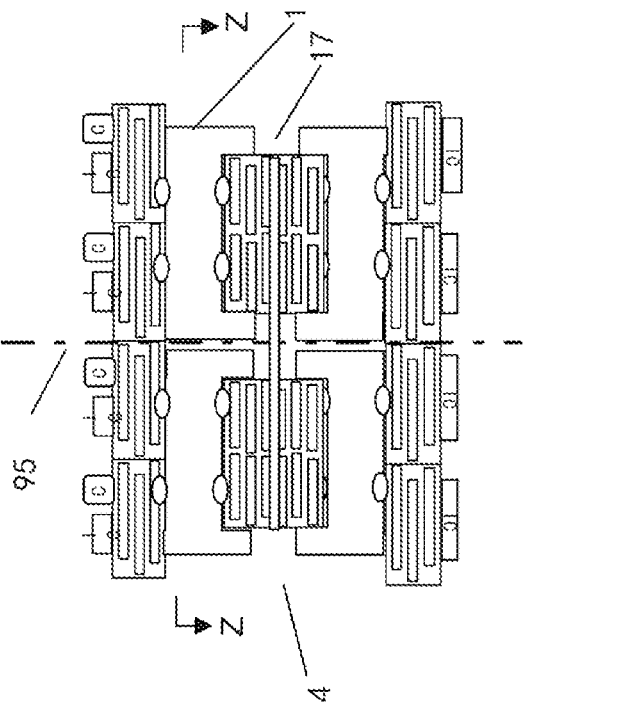
FIG. 15a is a sectional view along XX in FIG. 14c in another embodiment.

FIG. 15a is a sectional view along X-X in FIG. 14c in another embodiment. As shown in FIG. 15a, the first magnetic column 11 or the second magnetic column 12 is a "U"-shaped structure, and the gap between the opposite magnetic columns forms an air gap 17. FIG. 15b is a sectional view along Z-Z in FIG. 15a, showing that the panel circuit board 4 with the fourth circuit board 45-*a* and the fifth circuit board 45-*b* adhere to the upper surface and the lower surface of the to-be-cut pre-package to form a to-be-cut pre-package. The to-be-cut pre-package is cut along the cutting line 95 in FIGS. 15a and 15b to obtain a plurality of separate pre-packages 8. Circuit board 4 is with a panel structure and has a through-hole 91, such that the "U"-shaped magnetic core can be snapped therein. The pre-package 8 can be formed by cutting along the cutting line 95 in FIGS. 15a and 15b. There is no need to install the first magnetic cover 18 and the second magnetic cover 19 for pre-package 8, thereby simplifying the process, improving efficiency, and reducing cost.

Figures 16A, 16B:
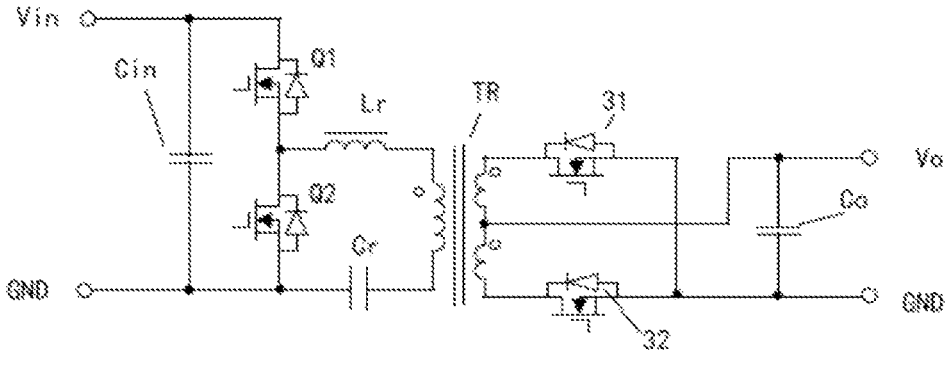
FIG. 16a is a half-bridge LLC circuit.
FIG. 16b is another type of half-bridge LLC circuit.
Figure 16C:
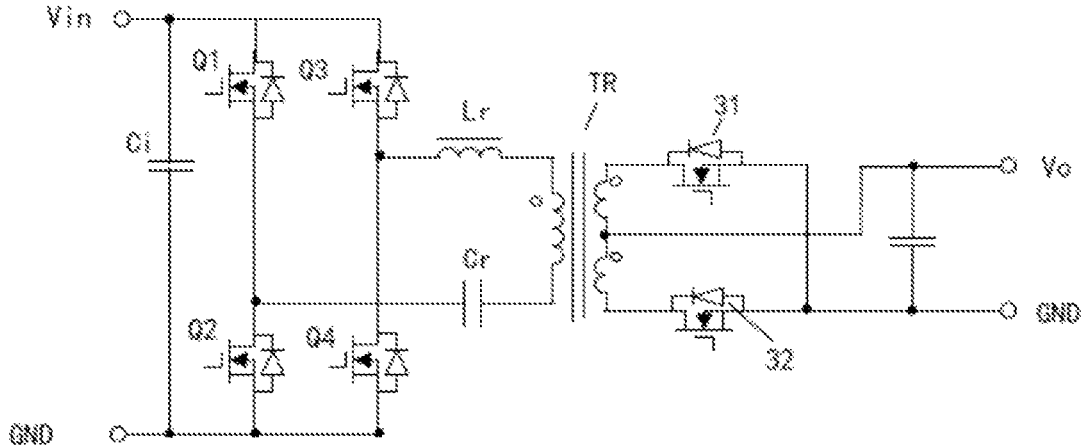
FIG. 16c is a full-bridge LLC circuit.
Figure 16D:
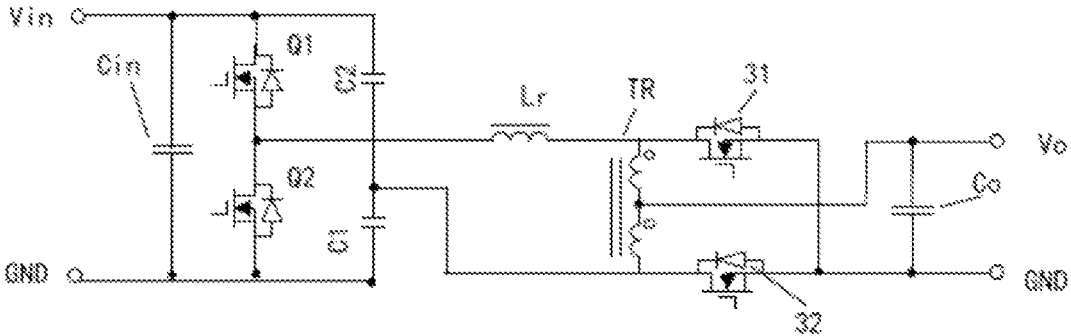
FIG. 16d is an LLC circuit with an autotransformer.

FIGS. 16a to 16d are schematic diagrams of some typical application circuits. FIG. 16a illustrates a half-bridge LLC circuit, FIG. 16b illustrates another type of half-bridge LLC circuit, FIG. 16c illustrates a full bridge LLC circuit, and FIG. 16d illustrates an LLC circuit with an autotransformer. In the figures, Q1 to Q4 represent switching devices of a primary bridge circuit, 31 represents a first rectifier device, and 32 represents a second rectifier device. TR represents a transformer (a magnetic element), Co represents an output capacitor, Cin represents an input capacitor, Lr represents a resonant inductor, and Cr represents a resonant capacitor. Vo represents an output positive electrode. In addition, the structure of the disclosure can also be applied to a Cuk circuit or a flyback circuit.

Although the disclosure has been disclosed in the embodiments, the disclosure is not limited thereto. Any skilled in the art shall make slight changes and modifications without departing from the spirit and scope of the disclosure, so the protection scope of the disclosure shall be determined by the scope defined by the appended claims.

What is claimed is:

1. A magnetic element, comprising:
   a first magnetic column;
   a second magnetic column;
   a first winding wound around the first magnetic column, comprising:
      a first horizontal winding and a second horizontal winding located above and below the first magnetic column, respectively, and
      a first vertical winding and a second vertical winding located at two sides of the first magnetic column, respectively; and
   a second winding wound around the second magnetic column, comprising:
      a third horizontal winding and a fourth horizontal winding located above and below the second magnetic column, respectively, and
      a third vertical winding and a fourth vertical winding located at two sides of the second magnetic column, respectively;
   wherein the first vertical winding and the third vertical winding are disposed on or in a first circuit board and a second circuit board, respectively, wherein the second vertical winding and the fourth vertical winding are disposed on or in a third circuit board, wherein the first circuit board, the first magnetic column, the third circuit board, the second magnetic column, and the second circuit board are sequentially bonded to form a pre-package, and
   wherein the first circuit board, the second circuit board, and the third circuit board are connected to the first horizontal winding, the second horizontal winding, the third horizontal winding, and the fourth horizontal winding through a plurality of first conductive vias, such that the first vertical winding, the first horizontal winding, the second vertical winding, and the second horizontal winding are sequentially connected through the plurality of first conductive vias, and that the fourth vertical winding, the third horizontal winding, the third vertical winding, and the fourth horizontal winding are sequentially connected through the plurality of first conductive vias.

2. The magnetic element according to claim 1, wherein an upper surface and a lower surface of the pre-package are coated by an insulating material.

3. The magnetic element according to claim 1, wherein each of the first circuit board, the second circuit board, and the third circuit board has a conductive circuit layer, and wherein the first vertical winding, the second vertical winding, the third vertical winding, and the fourth vertical winding are formed by at least a part of the conductive circuit layer in respective circuit board.

4. The magnetic element according to claim 2, wherein the first circuit board is arranged at an outer side of the first magnetic column, wherein the second circuit board is arranged at an outer side of the second magnetic column, wherein the third circuit board is arranged between the first magnetic column and the second magnetic column, and wherein end faces of the first circuit board, the second circuit board, and the third circuit board are provided with terminals electrically connected to the conductive circuit layers of the first circuit board, the second circuit board, and the third circuit board, respectively.

5. The magnetic element according to claim 4, wherein the terminals of the first circuit board, the second circuit board, and the third circuit board at the same side are in a common plane.

6. The magnetic element according to claim 2, wherein the first horizontal winding, the second horizontal winding, the third horizontal winding, and the fourth horizontal winding are all in the insulating material.

7. The magnetic element according to claim 4, wherein the first horizontal winding and the third horizontal winding are disposed on or in a fourth circuit board, wherein the second horizontal winding and the fourth horizontal winding are disposed on or in a fifth circuit board, wherein both the fourth circuit board and the fifth circuit board have a conductive circuit layer, wherein the first horizontal winding, the second horizontal winding, the third horizontal winding, and the fourth horizontal winding are formed by at least a part of the conductive circuit layer in respective circuit boards, and wherein the plurality of first conductive vias penetrate through the fourth circuit board and the fifth circuit board and connect the conductive circuit layers in the fourth circuit board and the fifth circuit board to the terminals.

8. The magnetic element according to claim 4, wherein the third circuit board comprises two separate circuit boards bonded through a first bonding layer, wherein the second vertical winding and the fourth vertical winding are disposed on or in two separate circuit boards respectively, and wherein there is a plurality of terminals arranged in a column on each end face of the separate circuit boards.

9. The magnetic element according to claim 4, wherein the second vertical winding and the fourth vertical winding share one section of the conductive circuit layer, and wherein the terminals of the third circuit board are arranged in a column.

10. The magnetic element according to claim 4, wherein the terminals of the first circuit board and the second circuit board are arranged in a column.

11. The magnetic element according to claim 3, wherein the pre-package further comprises a third magnetic column and a sixth circuit board, wherein the first magnetic column, the second magnetic column, and the third magnetic column are arranged in parallel, and wherein the third magnetic column is located between the second circuit board and the sixth circuit board.

12. The magnetic element according to claim 11, wherein the magnetic element further comprises two side magnetic columns respectively at outer sides of the first circuit board and the sixth circuit board.

13. The magnetic element according to claim 7, wherein the magnetic element further comprises two second bonding layers disposed on the upper surface and the lower surface of the pre-package, respectively, and wherein the plurality of first conductive vias penetrate through the two second bonding layers and connect the conductive circuit layers in the fourth circuit board and the fifth circuit board to the terminals on the end faces of the first circuit board, the second circuit board, and the third circuit board.

14. The magnetic element according to claim 2, wherein glue dispensing is disposed between the first circuit board and the first magnetic column, between the first magnetic column and the third circuit board, between the third circuit board and the second magnetic column, and between the second magnetic column and the second circuit board, and wherein the first circuit board, the first magnetic column, the third circuit board, the second magnetic column, and the second circuit board are bonded together by the glue.

15. The magnetic element according to claim 1, wherein the magnetic element further comprises two magnetic covers disposed on two end faces of the first magnetic column, respectively.

16. The magnetic element according to claim 1, wherein the first magnetic column and the second magnetic column are with a U-shaped structure.

17. A power supply module comprising the magnetic element according to claim 1, further comprising:

an output pin disposed on a lower surface of the magnetic element; and an electronic component disposed on an upper surface, the lower surface, or a lateral surface of the magnetic element.

* * * * *